US009231035B2

(12) United States Patent
Kim et al.

(10) Patent No.: US 9,231,035 B2
(45) Date of Patent: Jan. 5, 2016

(54) ORGANIC LIGHT EMITTING DIODE DISPLAY DEVICE HAVING IMPROVED EFFECTIVE EMITTING AREA

(71) Applicant: LG DISPLAY CO., LTD, Seoul (KR)

(72) Inventors: Kang-Hyun Kim, Gyeongju-si (KR); Ki-Soub Yang, Paju-si (KR); Dae-Jung Choi, Paju-si (KR); Seung-Ryul Choi, Goyang-si (KR); A-Ryoung Lee, Seoul (KR); Han-Hee Kim, Anseong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/010,985

(22) Filed: Aug. 27, 2013

(65) Prior Publication Data

US 2014/0145157 A1    May 29, 2014

(30) Foreign Application Priority Data

Nov. 26, 2012 (KR) .......................... 10-2012-0134298

(51) Int. Cl.
*H01L 27/32* (2006.01)
(52) U.S. Cl.
CPC ............ *H01L 27/3246* (2013.01); *H01L 27/32* (2013.01); *H01L 27/3244* (2013.01)

(58) Field of Classification Search
CPC ..... H01L 51/0005; H01L 51/50; H01L 51/56; H01L 27/32; H01L 27/3246; H05B 33/20; H05B 33/10
USPC ......................................... 257/40; 438/34, 46
See application file for complete search history.

(56) References Cited

U.S. PATENT DOCUMENTS

| 2005/0057151 A1* | 3/2005 | Kuwabara ...................... 313/506 |
| 2005/0073249 A1* | 4/2005 | Morii et al. .................... 313/504 |
| 2013/0038203 A1* | 2/2013 | Kim .............................. 313/504 |

* cited by examiner

*Primary Examiner* — Evan Pert
*Assistant Examiner* — Changhyun Yi
(74) *Attorney, Agent, or Firm* — Brinks Gilson & Lione

(57) ABSTRACT

An organic light emitting diode display device includes a substrate including a display region, wherein a plurality of pixel regions are defined in the display region; a first electrode over the substrate and in each of the plurality of pixel regions; a first bank on edges of the first electrode; a second bank on an upper surface of the first bank and covering only a portion of the first bank; an organic emitting layer on the first electrode and a portion of the first bank; and a second electrode on the organic emitting layer and covering an entire surface of the display region.

10 Claims, 5 Drawing Sheets

ORGANIC LIGHT EMITTING DIODE DISPLAY DEVICE HAVING IMPROVED EFFECTIVE EMITTING AREA

The present application claims the benefit of Korean Patent Application No. 10-2012-0134298 filed in Korea on Nov. 26, 2012, which is herein incorporated by reference in its entirety.

BACKGROUND

1. Technical Field

The present disclosure relates to an organic light emitting diode (OLED) display device, and more particularly, to an OLED display device having improved aperture ratio and lifetime.

2. Prior Art

An OLED display device used in flat panel display devices has a high brightness and low driving voltage. The OLED display device is a self-emitting type and has excellent characteristics of a view angle, a contrast ratio, a response time and so on.

Accordingly, the OLED display device is being widely used for a television, a monitor, a mobile phone, and so on.

The OLED display device includes an array element and an organic light emitting diode. The array element includes a switching thin film transistor (TFT), which is connected to a gate line and a data line, a driving TFT, which is connected to the switching TFT, and a power line, which is connected to the driving TFT. The organic light emitting diode includes a first electrode, which is connected to the driving TFT, and an organic emitting layer and a second electrode. In the OLED display device, light from the organic emitting layer passes through the first electrode or the second electrode to display an image.

Generally, the organic emitting layer is formed by a thermal deposition using a shadow mask. However, the shadow mask sags because the shadow mask becomes larger with larger display devices. As a result, there is a problem in deposition uniformity in the larger display device. In addition, since a shadow effect is generated in the thermal deposition using the shadow mask, it is very difficult to fabricate a high resolution OLED display device, e.g., above 250 PPI (pixels per inch).

Accordingly, new method instead of the thermal deposition using the shadow mask is introduced.

In the new method, a liquid phase organic emitting material is sprayed or dropped in a region surrounded by a wall using an ink-jet apparatus or a nozzle-coating apparatus and cured to form the organic emitting layer.

FIG. 1 is a schematic cross-sectional view showing a step of forming an organic emitting layer by spraying or dropping a liquid phase organic emitting material.

To spray or drop the liquid phase organic emitting material by the ink-jet apparatus or the nozzle-coating apparatus, a bank 53, which is formed on the first electrode 50 and surrounds a pixel region P is required to prevent the liquid phase organic emitting material from flooding into adjacent pixel region P. Accordingly, as shown in FIG. 1, the bank 53 is formed on edges of the first electrode 50 before forming the organic emitting layer 55.

The bank 53 is formed of an organic material having a hydrophobic property. The hydrophobic bank 53 prevents the organic emitting material, which has a hydrophilic property, from being formed on the bank 53 and flooding into adjacent pixel region P.

By spraying or dropping the liquid phase organic emitting material from a head of the ink-jet apparatus or a nozzle of the nozzle-coating apparatus into the pixel region P, which is surrounded by the bank 53, the pixel region P is filled with the organic emitting material. The organic emitting material is dried and cured by a heat to form the organic emitting layer 55.

However, the organic emitting layer 55 has a difference in a thickness. Namely, the organic emitting layer 55 has a thickness in edges being larger than a thickness in a center.

If the organic emitting layer 55 has a thickness difference, the OLED display device has a difference in emitting efficiency. Accordingly, as shown in FIG. 2, which is a picture showing one pixel region in the prior art OLED display device, dark images are displayed in edges of the pixel region. In this instance, since the dark edges are perceived as an image defect by the viewer, the edges of the pixel region should be shielded such that the edges of the pixel region do not serve as an effective emitting area.

Referring again to FIG. 1, an effective emitting area EA1 is a portion of the pixel region P where the organic emitting layer 55 has a flat top surface. Namely, the aperture ratio of the OLED display device is decreased.

SUMMARY

An organic light emitting diode display device includes a substrate includes a display region, wherein a plurality of pixel regions are defined in the display region; a first electrode over the substrate and in each of the plurality of pixel regions; a first bank on edges of the first electrode and having a first width and a first thickness; a second bank on the first bank and having a second width smaller than the first width; an organic emitting layer on the first electrode and a portion of the first bank; and a second electrode on the organic emitting layer and covering an entire surface of the display region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to the exemplary embodiments, examples of which are illustrated in the accompanying drawings.

Figure 3:
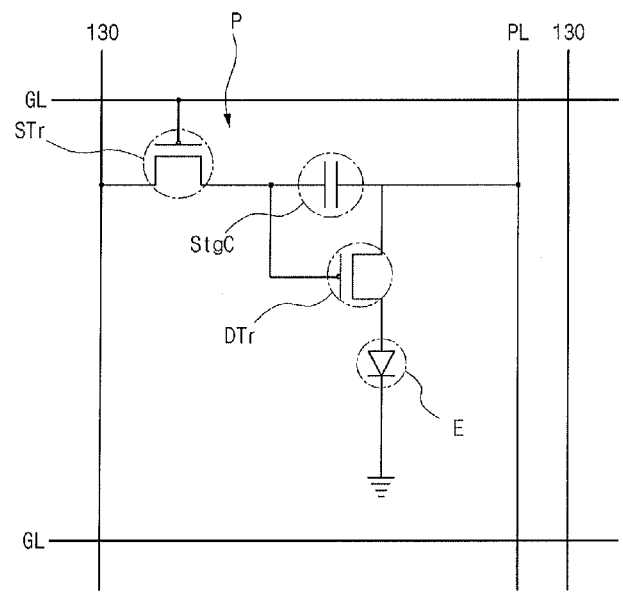
FIG. 3 is a circuit diagram of one sub-pixel region of an OLED device.

FIG. 3 is a circuit diagram of one sub-pixel region of an OLED device.

As shown in FIG. 3, an OLED display device includes a switching thin film transistor (TFT) STr, a driving TFT DTr, a storage capacitor StgC and an emitting diode E in each pixel region P.

On a substrate (not shown), a gate line GL along a first direction and a data line 130 along a second direction are formed. The gate line GL and the data line 130 cross each other to define the pixel region P. A power line PL for providing a voltage to the emitting diode E is formed to be parallel to and spaced apart from the data line 130.

The switching TFT STr is connected to the gate and data lines GL and 130, the driving TFT DTr and the storage capacitor StgC are connected to the switching TFT STr and the power line PL. The emitting diode E is connected to the driving TFT DTr.

A first electrode of the emitting diode E is connected to a drain electrode of the driving TFT DTr, and a second electrode of the emitting diode E is grounded.

When the switching TFT STr is turned on by a gate signal applied through the gate line GL, a data signal from the data line 130 is applied to the gate electrode of the driving TFT DTr and an electrode of the storage capacitor StgC. When the driving TFT DTr is turned on by the data signal, an electric current is supplied to the emitting diode E from the power line PL. As a result, the emitting diode E emits light. In this case, when the driving TFT DTr is turned on, a level of an electric current applied from the power line PL to the emitting diode E is determined such that the emitting diode E can produce a gray scale. The storage capacitor StgC serves to maintain the voltage of the gate electrode of the driving TFT DTr when the switching TFT STr is turned off. Accordingly, even if the switching TFT STr is turned off, a level of an electric current applied from the power line PL to the emitting diode E is maintained to next frame.

Figure 4:
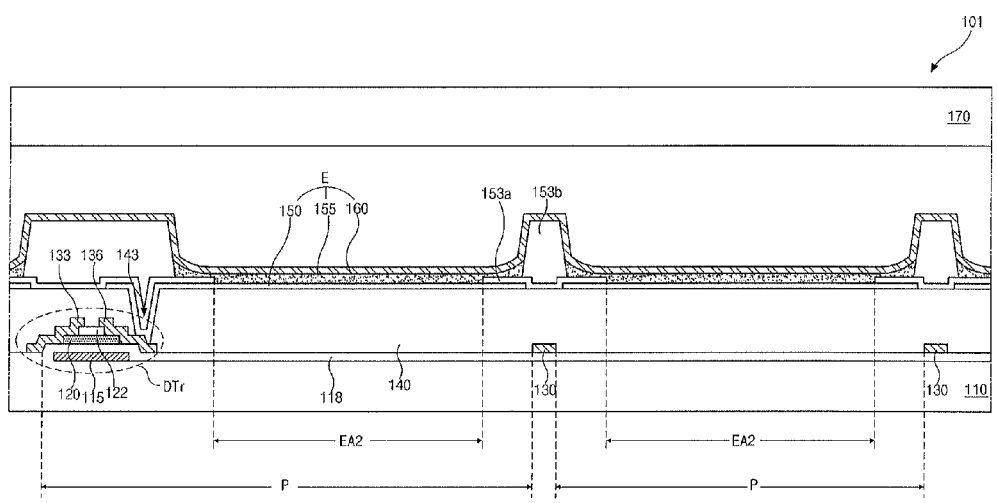
FIG. 4 is a schematic cross-sectional view of an OLED display device according to an embodiment of the present invention.

FIG. 4 is a schematic cross-sectional view of an OLED display device according to an embodiment of the present invention. FIG. 4 shows one driving TFT DTr in one pixel region P. However, the driving TFT DTr is formed in each pixel region P.

As shown in FIG. 4, an OLED display device 101 of the present invention includes a first substrate 110, where a driving TFT DTr, a switching TFT (not shown) and an organic emitting diode E are formed, and a second substrate 170 for encapsulation. The second substrate 170 may be an inorganic insulating film or an organic insulating film.

A gate line (not shown) and a data line 130 are formed on the first substrate 110. The gate line and the data line 130 cross each other to define the pixel region P. A power line (not shown) for providing a voltage to the emitting diode E is formed to be parallel to and spaced apart from the data line 130.

In each pixel region P, the switching TFT is connected to the gate line and the data line 130, the driving TFT DTr and the storage capacitor StgC are connected to the switching TFT and the power line.

The driving TFT DTr includes a gate electrode 115, a gate insulating layer 118, an oxide semiconductor layer 120, an etch-stopper 122, a source electrode 133 and a drain electrode 136. The gate insulating layer 118 covers the gate electrode 115, and the oxide semiconductor layer 120 is disposed on the gate insulating layer 118. The oxide semiconductor layer 120 corresponds to the gate electrode 115. The etch-stopper 122 covers a center of the oxide semiconductor layer 120. The source electrode 133 and the drain electrode 136 are disposed on the etch-stopper 122 and spaced apart from each other. The source electrode 133 and the drain electrode 136 contact both ends of the oxide semiconductor layer 120, respectively. Although not shown, the switching TFT has substantially the same structure as the driving TFT DTr.

Figure 5:
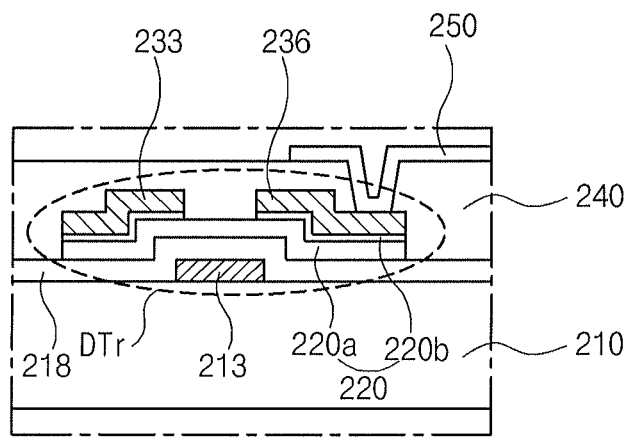
FIG. 5 is a schematic cross-sectional view of an OLED display device according to one modified embodiment of the present invention.

In FIG. 4, each of the driving TFT DTr and the switching TFT includes the oxide semiconductor layer 120 of an oxide semiconductor material. Alternatively, as shown in FIG. 5, each of the driving TFT DTr and the switching TFT may include a gate electrode 213, a gate insulating layer 218, a semiconductor layer 220 including an active layer 220a of intrinsic amorphous silicon and an ohmic contact layer 220b of impurity-doped amorphous silicon, a source electrode 233 and a drain electrode 236.

Figure 6:
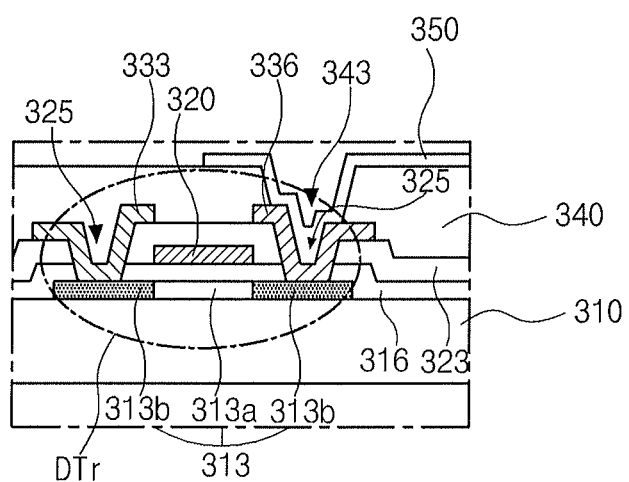
FIG. 6 is a schematic cross-sectional view of an OLED display device according to another modified embodiment of the present invention.

In addition, each of the driving TFT DTr and the switching TFT may have a top gate structure where the semiconductor layer is positioned at a lowest layer. Namely, as shown in FIG. 6, each of the driving TFT DTr and the switching TFT may include a semiconductor layer 313, which includes an active region 313a of intrinsic poly-silicon and impurity-doped regions 313b at both sides of the active region 313a, on a first substrate 310, a gate insulating layer 316, a gate electrode 320 corresponding to the active region 313a of the semiconductor layer 313, an interlayer insulating layer 323 having semiconductor contact holes 325, which expose the impurity-doped regions 313b of the semiconductor layer 313, and source and drain electrodes 333 and 336 respectively connected to the impurity-doped regions 313b through the semiconductor contact holes 325.

The top gate structure TFT requires the interlayer insulating layer 323 in comparison to a bottom gate structure TFT. In the top gate structure TFT, the gate line is formed on the gate insulating layer 316, and the data line is formed on the interlayer insulating layer 323.

Referring again to FIG. 4, a passivation layer 140, which includes a drain contact hole 143 exposing the drain electrode 136 of the driving TFT DTr, is formed over the driving TFT DTr and the switching TFT. For example, the passivation layer 140 may be formed of an organic insulating material, e.g., photo-acryl, to have a flat top surface.

A first electrode 150, which contacts the drain electrode 136 of the driving TFT DTr through the drain contact hole 143, is formed on the passivation layer 140 and separately in each pixel region P.

The first electrode 150 is formed of a conductive material having a relatively high work function, e.g., about 4.8 to 5.2 eV. For example, the first electrode 150 may be formed of a transparent conductive material such as indium-tin-oxide (ITO) to serve as an anode.

When the first electrode 150 is formed of the transparent conductive material, a reflection layer (not shown) may be formed under the first electrode 150 to increase emission efficiency in a top emission type OLED display device. For example, the reflection layer may be formed of a metallic material, such as aluminum (Al) or Al alloy (AlNd), having a relatively high reflectivity.

With the reflection layer, the light from the organic emitting layer 155, which is formed on the first electrode 150, is reflected by the reflection layer such that the emission efficiency is increased. As a result, the OLED display device has an improved brightness property.

A first bank 153a having a first width is formed along boundaries of the pixel region P. Namely, the first bank 153a is formed on edges of the first electrode 150 such that a center of the first electrode 150 is exposed by the first bank 153a. The first bank 153a includes a hydrophilic material. For example, the first bank 153a may be formed of an inorganic insulating material. Particularly, the first bank 153a may be formed of at least one of silicon oxide or silicon nitride. A thickness of the first bank 153a is smaller than that of the organic emitting layer 155. The thickness of the first bank 153b may have a range within about 0.2 to 1.5 micrometer.

In addition, a second bank 153b is formed on the first bank 153a. The second bank 153b has a second width smaller than the first width of the first bank 153a and completely overlaps the first bank 153a. As a result, the first bank 153a protrudes from the second bank 153b by a width within about 1 to 9 micrometer. In other words, edges of the first bank 153a are exposed by the second bank 153b. The first width of the first bank 153a is substantially the same as the bank 53 in the prior art OLED display device.

The second bank 153b includes an organic insulating material having a hydrophobic property. Namely, the second bank 153b is formed of an organic insulating material having a hydrophobic property or an organic insulating material containing a hydrophobic material. For example, the second bank 153b may be formed of at least one of polyimide containing fluorine (F), styrene, methylmethacrylate, polytetrafluoroethylene, such as Teflon.

In the OLED display device 101 including the first bank 153a, which has the first width and the thickness being smaller than the organic emitting layer 155, and the second bank 153b having the second width being smaller than the first width of the first bank 153a, the organic emitting layer 155 is formed on the first bank 153a and the organic emitting material is concentrated into a center of the pixel region P by the first bank 153a. As a result, a problem of increase of a thickness of the organic emitting layer 155 in a region adjacent to the first bank 153a is reduced.

Figure 1:
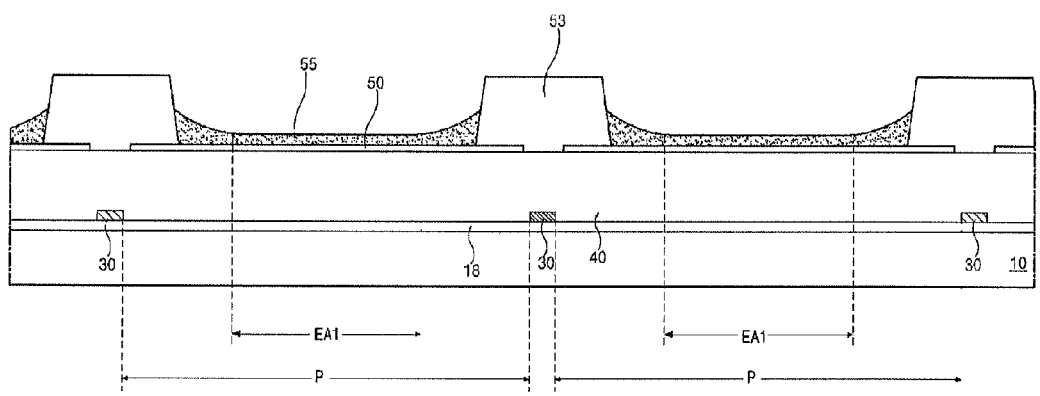
FIG. 1 is a schematic cross-sectional view showing a step of forming an organic emitting layer by spraying or dropping a liquid phase organic emitting material.
Figure 2:
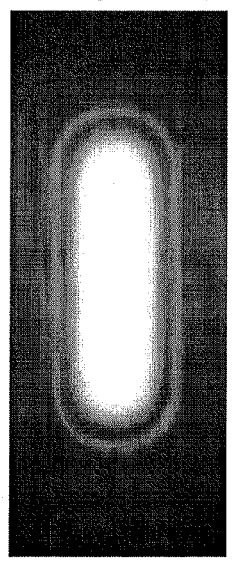
FIG. 2 is a picture showing one pixel region in the prior art OLED display device.

In addition, since the first bank 153a has substantially the same width as the bank 53 (of FIG. 1), a region surrounded by the second bank 153b, which has a second width smaller than the first bank 153a, is larger than that surrounded by the bank 53.

Moreover, since the first bank 153a has the thickness smaller than the organic emitting layer 155, the organic emitting layer 155 is formed on the first bank 153a.

Furthermore, since the organic emitting layer 155 on the first bank 153a has a portion forming substantially flat top surface with the center of the pixel region P, the organic emitting layer 155 has the flat top surface in a region surrounded by the first bank 153a.

Accordingly, an emitting area EA2, which is defined as a region of the organic emitting layer having the flat top surface, is increased in comparison to the emitting area EA1 (of FIG. 1) in the prior art OLED display device such that the OLED display device of the present invention has improved aperture ratio.

Figure 7:
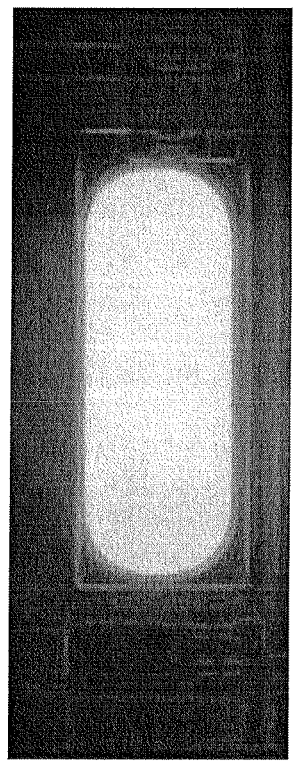
FIG. 7 is a picture showing one pixel region in an OLED display device according to the present invention.

Referring to FIG. 7, which is a picture showing one pixel region in an OLED display device according to the present invention, the emitting area EA2 (of FIG. 4) in the OLED display device of the present invention is increased in comparison to the emitting area EA1 (of FIG. 1) in the prior art OLED display device. In addition, brightness uniformity of the OLED display device of the present invention is improved.

Figure 8A:
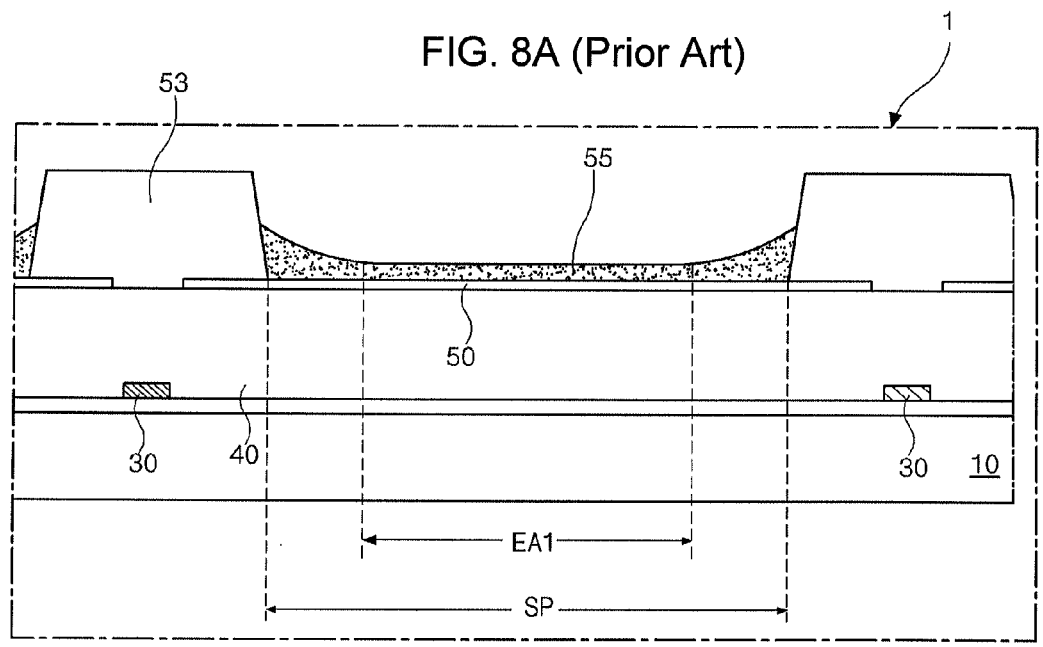
FIGS. 8A and 8B are schematic cross-sectional views explaining effective emitting areas of the prior art OLED display device and an OLED display device according to the present invention.
Figure 8B:
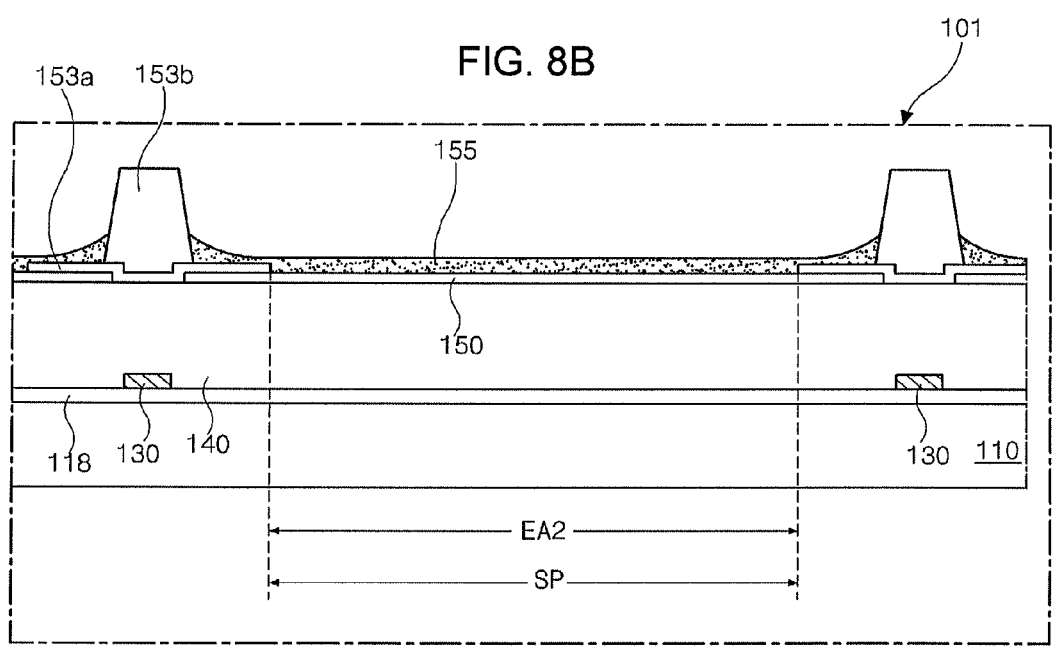

FIG. 8 is a schematic cross-sectional view explaining effective emitting areas of the prior art OLED display device and an OLED display device according to the present invention.

With the size pixel region, an effective pixel region SP is defined as a region surrounded by the bank. In this instance, referring to FIG. 8, the effective pixel region SP in the prior art OLED display device is a region surrounded by the bank 53, while the effective pixel region SP in the OLED display device of the present invention is a region surrounded by the first bank 153a. The area of the effective pixel regions SP in the prior art OLED display device and the OLED display device of the present invention is equal.

However, an area of the effective emitting area EA2 in the effective pixel region SP of the OLED display device of the present invention is larger than that of the effective emitting area EA1 in the effective pixel region SP of the prior art OLED display device.

Since the organic emitting layer 55 has a thickness difference in the edges of the effective pixel region SP, the effective emitting area EA1 is smaller than the effective pixel region SP. However, since the organic emitting layer 155 has a thickness uniformity in an entire surface of the effective pixel region SP, the effective emitting area EA2 is equal to the effective pixel region SP. Namely, an area of the effective emitting area EA2 in the effective pixel region SP of the OLED display device of the present invention is larger than that of the effective emitting area EA1 in the effective pixel region SP of the prior art OLED display device such that the aperture ratio of the OLED display device is increased.

Referring again to FIG. 4, the organic emitting layer 155 is formed on the first electrode 150 and in an opening of the second bank 153b. The organic emitting layer 155 includes red, green and blue emitting material in each pixel region P.

The organic emitting layer 155 is formed by forming an organic emitting material layer and curing the organic emitting material layer. The organic emitting material layer is formed by coating, i.e., spraying or dropping a liquid phase organic material by an ink-jet apparatus or a nozzle-coating apparatus.

FIG. 4 shows a single-layered organic emitting layer 155. Alternatively, to improve emission efficiency, the organic emitting layer 155 may have a multi-layered structure. For example, the organic emitting layer 155 may include a hole injecting layer, a hole transporting layer, an emitting material layer, an electron transporting layer and an electron injecting layer stacked on the first electrode 150 as an anode. The organic emitting layer 155 may be a quadruple-layered structure of the hole transporting layer, the emitting material layer, the electron transporting layer and an electron injecting layer or a triple-layered structure of the hole transporting layer, the emitting material layer and the electron transporting layer.

A second electrode 160 is formed on the organic emitting layer 155 and covers an entire surface of a display region of the first substrate 110. The second electrode 160 is formed of a metallic material having a relatively low work function, e.g., Al, Al alloy, silver (Ag), magnesium (Mg), gold (Au), Al—Mg alloy (AlMg). The second electrode 160 serves as a cathode. In the top emission type OLED display device, the second electrode 160 has a transparent property. On the other hand, in a bottom emission type OLED display device, the second electrode 160 has a reflective property.

The first electrode 150, the organic emitting layer 155 and the second electrode 160 constitute the emitting diode E.

A seal pattern (not shown) of a sealant or a frit material is formed on edges of the first substrate 110 or the second substrate 170. The first and second substrates 110 and 170 are attached using the seal pattern. A space between the first and second substrates 110 and 170 has a vacuum condition or an inert gas condition. The second substrate 170 may be a flexible plastic substrate or a glass substrate.

Alternatively, the second substrate 170 may be a film contacting the second electrode 160. In this instance, the film-type second substrate is attached to the second electrode 160 by an adhesive layer.

In addition, an organic insulating film or an inorganic insulating film may be formed on the second electrode 160 as a capping layer. In this instance, the organic insulating film or the inorganic insulating film serves as the encapsulation film without the second substrate 170.

In the OLED display device 101 including the first bank 153a, which has the thickness being smaller than the organic emitting layer 155, and the second bank 153b having the second width being smaller than the first width of the first bank 153a, the organic emitting layer 155 is formed on the first bank 153a and the organic emitting material is concentrated into a center of the pixel region P by the first bank 153a. As a result, a problem of increase of a thickness of the organic emitting layer 155 in a region adjacent to the first bank 153a is reduced.

In addition, since the organic emitting layer 155 on the first bank 153a has a portion forming substantially flat top surface with the center of the pixel region P, the organic emitting layer 155 has a uniform thickness in a region surrounded by the first bank 153a. As a result, an emitting area EA2 is increased in comparison to the emitting area EA1 (of FIG. 1) in the prior art OLED display device such that the OLED display device of the present invention has improved aperture ratio.

Moreover, since an area having thickness uniformity of the organic emitting layer 155 is increased, brightness uniformity of the OLED display device of the present invention is improved. Furthermore, due to the thickness uniformity of the organic emitting layer 155, a thermal degradation problem of the organic emitting layer is prevented such that the OLED display device has an improved lifetime.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
    a substrate including a display region, wherein a plurality of pixel regions are defined in the display region;
    a first electrode over the substrate and in each of the plurality of pixel regions;
    a first bank on edges of the first electrode;
    a second bank on an upper surface of the first bank and covering only a portion of the first bank;
    an organic emitting layer on the first electrode and a portion of the first bank; and
    a second electrode on the organic emitting layer and covering an entire surface of the display region,
    wherein the first bank has a protruding edge, which contacts the first electrode, from the second bank, and the organic emitting layer contacts an entire upper surface of the protruding edge, and
    wherein the first bank includes a material having a hydrophilic property, and the second bank includes a material having a hydrophobic property.

2. The device according to claim 1, wherein the first bank has at least one of either silicon oxide or silicon nitride.

3. The device according to claim 1, wherein the second bank has at least one of polyimide containing fluorine (F), styrene, methyl methacrylate (MMA), or polytetrafluoroethylene (PTFE).

4. The device according to claim 1, wherein the organic emitting layer on the portion of the first bank has a flat top surface with the organic emitting layer on a center of the pixel region.

5. The device according to claim 1, wherein the organic emitting layer in a region surrounded by the first bank has a uniform thickness.

6. The device according to claim 1, wherein the organic emitting layer is thicker than the first bank.

7. The device according to claim 1, wherein the first bank has a first thickness in a range between about 0.2 and 1.5 micrometer.

8. The device according to claim 1, wherein the second bank completely overlaps the first bank such that the first bank protrudes from the second bank.

9. The device according to claim 1, wherein the protruding edge has a range between about 1 and 9 micrometers.

10. The device according to claim 1, further comprising a thin film transistor in each pixel region, wherein the first electrode is connected to the thin film transistor.

* * * * *